US012648101B2

(12) United States Patent
Su et al.

(10) Patent No.: US 12,648,101 B2
(45) Date of Patent: Jun. 2, 2026

(54) INTERFACE CARD QUICK RELEASE DEVICE

(71) Applicant: Auras Technology Co., Ltd., New Taipei City (TW)

(72) Inventors: Chien-Chih Su, New Taipei City (TW); Wan-Fang Lin, New Taipei City (TW); Ni-Ni Lee, New Taipei City (TW)

(73) Assignee: AURAS TECHNOLOGY CO., LTD., New Taipei City (TW)

( * ) Notice: Subject to any disclaimer, the term of this patent is extended or adjusted under 35 U.S.C. 154(b) by 216 days.

(21) Appl. No.: 18/397,805

(22) Filed: Dec. 27, 2023

(65) Prior Publication Data

US 2024/0284625 A1     Aug. 22, 2024

Related U.S. Application Data

(60) Provisional application No. 63/455,480, filed on Mar. 29, 2023, provisional application No. 63/447,117, filed on Feb. 21, 2023.

(51) Int. Cl.
H05K 7/00 (2006.01)
H05K 7/14 (2006.01)

(52) U.S. Cl.
CPC .................................. H05K 7/1405 (2013.01)

(58) Field of Classification Search
CPC ............................ H05K 7/1405; H05K 7/1409
See application file for complete search history.

(56) References Cited

U.S. PATENT DOCUMENTS

| | | | | |
|---|---|---|---|---|
| 7,408,788 B2 * | 8/2008 | Rubenstein | .......... | H05K 7/1409 |
| | | | | 361/801 |
| 8,403,689 B2 * | 3/2013 | Li | ......... | H01R 12/721 |
| | | | | 439/160 |
| 8,422,216 B2 * | 4/2013 | Liang | ...................... | G06F 1/183 |
| | | | | 361/801 |
| 8,602,677 B2 * | 12/2013 | Peng | ....................... | G06F 1/185 |
| | | | | 361/801 |
| 8,771,001 B2 * | 7/2014 | Li | ........................ | H01R 13/639 |
| | | | | 439/328 |
| 8,848,359 B1 * | 9/2014 | Lin | ........................ | G06F 1/1656 |
| | | | | 439/131 |
| 8,848,379 B2 * | 9/2014 | He | ..................... | H01R 12/7029 |
| | | | | 361/755 |
| 9,454,190 B2 * | 9/2016 | Mao | ..................... | H05K 7/1487 |
| 9,735,485 B2 * | 8/2017 | Schulze | ............... | H01R 12/721 |
| 9,925,440 B2 * | 3/2018 | Davis | ..................... | A63B 59/70 |
| 9,927,834 B2 * | 3/2018 | Hua | ......................... | G06F 1/185 |
| 11,853,131 B2 * | 12/2023 | Chen | .................... | H05K 7/1402 |
| 11,868,187 B2 * | 1/2024 | Chen | ........................ | G06F 1/185 |
| 12,374,829 B2 * | 7/2025 | Lai | ......................... | H01R 13/633 |
| 2021/0153372 A1 * | 5/2021 | Sung | .................... | H05K 7/1418 |
| 2021/0352818 A1 * | 11/2021 | Chang | .................. | H05K 7/1404 |
| 2022/0087044 A1 * | 3/2022 | Tan | ..................... | H05K 7/1424 |
| 2023/0010194 A1 * | 1/2023 | Chen | .................... | H05K 7/1405 |
| 2024/0284625 A1 * | 8/2024 | Su | ......................... | H05K 7/1405 |

* cited by examiner

*Primary Examiner* — Rockshana D Chowdhury
(74) *Attorney, Agent, or Firm* — Muncy, Geissler, Olds & Lowe, P.C.

(57) ABSTRACT

An interface card quick release device includes a housing, a release device and a release link. The release link is arranged in the housing. In addition, the housing includes an ejector, and a first end of the release link is movably coupled to the ejector. In addition, the release device controls the release link to push up an interface card.

13 Claims, 8 Drawing Sheets

116 ⎰ 422
     ⎨ 424
     ⎱ 426

1

INTERFACE CARD QUICK RELEASE DEVICE

RELATED APPLICATIONS

This application claims priorities to U.S. Provisional Application Ser. No. 63/447,117, filed Feb. 21, 2023 and U.S. Provisional Application Ser. No. 63/455,480, filed Mar. 29, 2023, the disclosures of which are incorporated herein by reference in their entireties.

TECHNICAL FIELD

The present disclosure relates to a quick release device. More particularly, the present disclosure relates to an interface card quick release device.

BACKGROUND

With the advancement of technology, electronic products have become more popular, and gradually changed the life or work of many people.

Slot connectors, such as PCI-Express (peripheral component interconnect express), provide a high-speed serial computer expansion bus standard, which can be used for interface cards such as storage modules, network cards, and graphics cards.

A slot connector usually includes a slot main body and a plurality of terminals. The terminals are embedded in the slot main body and are used to electrically connect an interface card inserted into the slot. Current slot connector usually includes a push buckle to fix the interface card inserted in the slot connector by rotating the push buckle to prevent the interface card from loosening.

Therefore, there is a need to easily and quickly remove the interface card from the slot to replace or repair the interface card when the interface card is installed in a relatively narrow space or when multiple interface cards are installed together so as to improve the efficiency and quality of the replacement or repair of the interface card.

SUMMARY

The summary of the present invention is intended to provide a simplified description of the disclosure to enable readers to have a basic understanding of the disclosure. The summary of the present invention is not a complete overview of the disclosure, and it is not intended to point out the importance of the embodiments/key elements of the present invention or define the scope of the invention.

One objective of the embodiments of the present invention is to provide an interface card quick release device able to conveniently remove the interface card from the interface card connection slot so as to effectively improve the efficiency and quality of the replacement or repair of the interface card.

To achieve these and other advantages and in accordance with the objective of the embodiments of the present invention, as the embodiment broadly describes herein, the embodiments of the present invention provides an interface card quick release device including a housing, a release device and a release link. The release link is arranged in the housing. In addition, the housing includes an ejector, a first end of the release link is movably coupled to the ejector, and the release device controls the release link to push up an interface card.

In some embodiments, the release device includes a release button. In addition, the release button includes a first slope, the release link includes a second slope, and the first slope of the release button contacts the second slope of the release link to move the release link.

In some embodiments, the interface card quick release device further includes a spring and a release device bottom plate, wherein the release device bottom plate is fixed to the housing, the release device bottom plate includes a bottom plate main body and a pillar, and the spring is disposed between the release button and the pillar to reset the release button.

In some embodiments, the release link includes a link main body, a sliding slot, a claw and a release bulge. The sliding slot is formed on the link main body, the claw is fixed on a first side of the link main body to fix the interface card, and the release bulge extends outwardly from the first side of the link main body to push up the ejector so as to push up the interface card.

In some embodiments, the release link further includes a stop bump coupled to a spring to reset the release link.

In some embodiments, the interface card quick release device further includes a sliding guide rod passing through the sliding slot and fixed on the housing so that the release link is movable relative to the housing.

In some embodiments, the interface card quick release device further includes a sliding slot screw including a threaded portion and a screw head, the screw head connected to the threaded portion, the threaded portion passing through the sliding slot to fix on the housing so as to support the release link with the screw head of the sliding slot screw.

In some embodiments, the release bulge includes a concave connecting portion and a U-shaped bulge. The concave connecting portion extends outwardly from the first side of the link main body and the U-shaped bulge connected to the concave connecting portion.

In some embodiments, the ejector includes a connecting portion and an eject block. The eject block is connected to the connecting portion. In addition, the U-shaped bulge of the release bulge is arranged under the connecting portion, and the eject block is arranged above the concave connecting portion when the interface card is installed in an interface card connection slot.

In some embodiments, the eject block includes a lifting slope, and the concave connecting portion includes a gentle rise slope to gradually push up the eject block by moving the gentle rise slope to contact the lifting slope of the eject block.

In some embodiments, the ejector further includes a pushing protrusion arranged on the eject block.

In some embodiments, a thickness of the connecting portion is smaller than a second height measured from a bottom of an interface card locking protrusion of the interface card to a top of the U-shaped bulge when the interface card is installed in the interface card connection slot.

In some embodiments, a first height of the pushing protrusion and the eject block plus a third height of the U-shaped bulge is greater than a fourth height measured from a bottom of an interface card locking protrusion of the interface card to a bottom of the U-shaped bulge when the interface card is installed in the interface card connection slot.

In some embodiments, a first height of the pushing protrusion and the eject block is greater than a second height measured from a bottom of the interface card locking protrusion of the interface card to a top of the U-shaped bulge when the interface card is installed in the interface card connection slot.

In some embodiments, the release device includes an electromagnetic actuator.

In some embodiments, the release device includes a motor.

Hence, the interface card quick release device according to some embodiments of the present disclosure may effectively move the interface card upward by manually or electrically, so that the user does not have to directly contact the interface card to lift the interface card. Therefore, the user may conveniently remove the interface card from the interface card connection slot so as to effectively improve the efficiency and quality of the replacement or repair of the interface card.

BRIEF DESCRIPTION OF THE DRAWINGS

The disclosure can be more fully understood by reading the following detailed description of the embodiment, with reference made to the accompanying drawings as follows.

DETAILED DESCRIPTION OF THE PREFERRED EMBODIMENT

Figure 1:
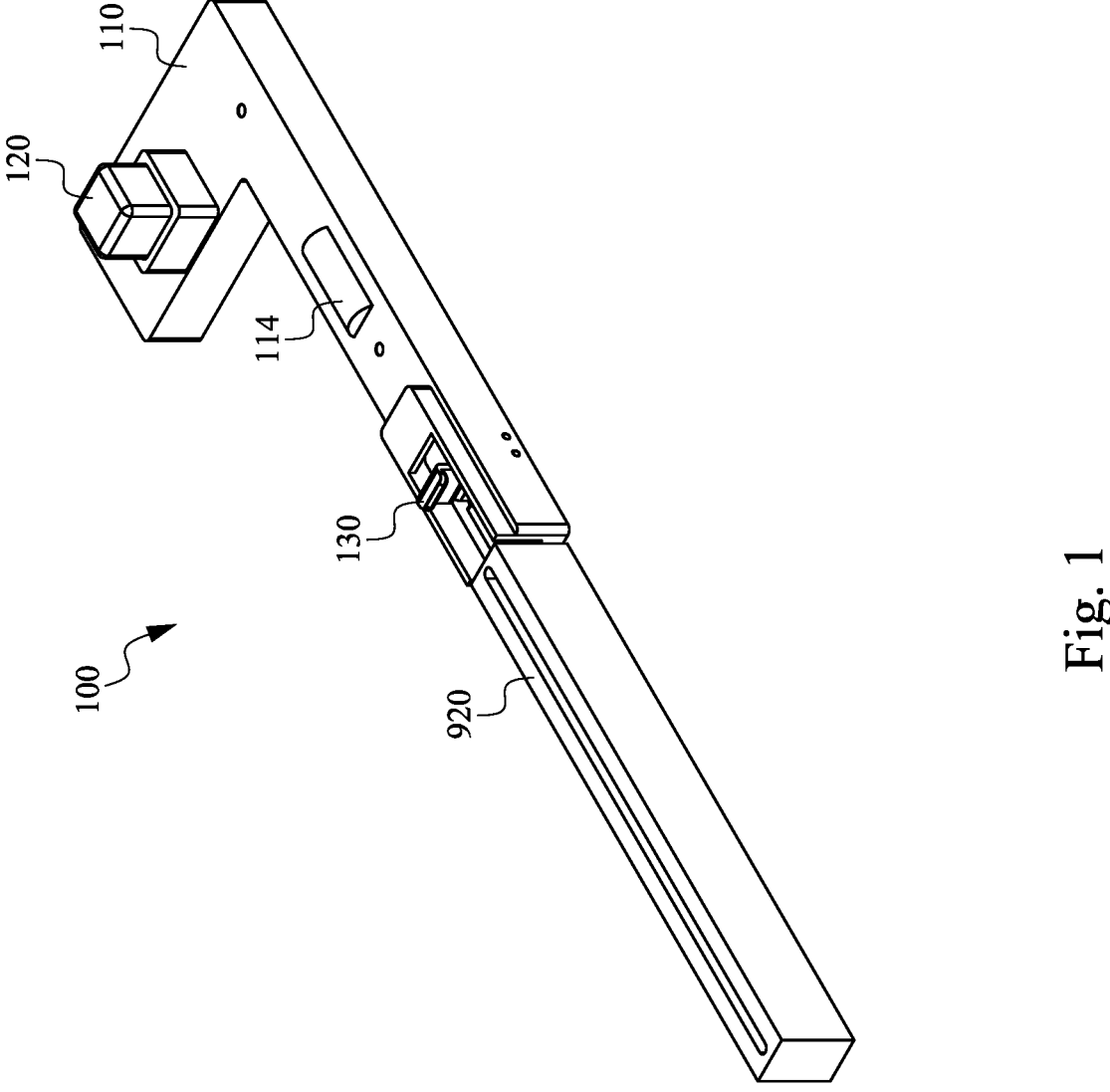
FIG. 1 illustrates a schematic perspective diagram of an interface card quick release device according to one embodiment of the present invention.

The following is a detailed description of the embodiments in conjunction with the accompanying drawings, but the provided embodiments are not intended to limit the scope of the disclosure, and the description of the structure and operation is not used to limit the execution sequence thereof. The structure of the recombination of components and the resulting devices with equal functions are all within the scope of this disclosure. In addition, the drawings are for illustration purposes only, and are not drawn according to the original scale. For ease of understanding, the same reference numbers are used in the drawings and the description to refer to the same or like parts.

In addition, the terms used in the entire description and the scope of the patent application, unless otherwise specified, usually have the usual meaning of each term used in this field, in the content disclosed here and in the special content. Some terms used to describe the disclosure are discussed below or elsewhere in this specification to provide additional guidance to those skilled in the art in the disclosure.

In the implementation mode and the scope of the present application, unless the article is specifically limited in the context, "a" and "the" can generally refer to a single or pluralities. In the steps, the numbering is only used to conveniently describe the steps, rather than to limit the sequence and implementation.

Secondly, the words "comprising", "including", "having", "containing" and the like used in the present application are all open language, meaning including but not limited to.

Figure 2:
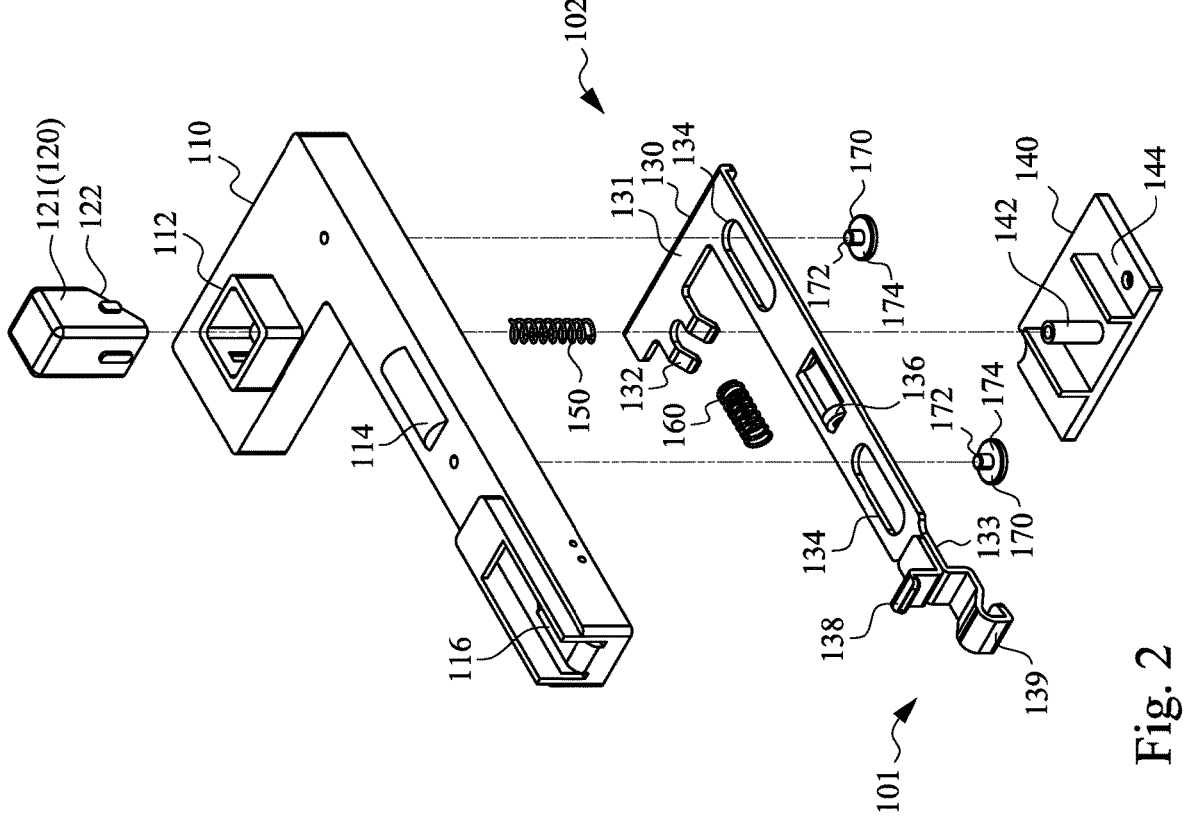
FIG. 2 is a schematic exploded perspective diagram of the interface card quick release device according to one embodiment of the present invention.
Figure 3:
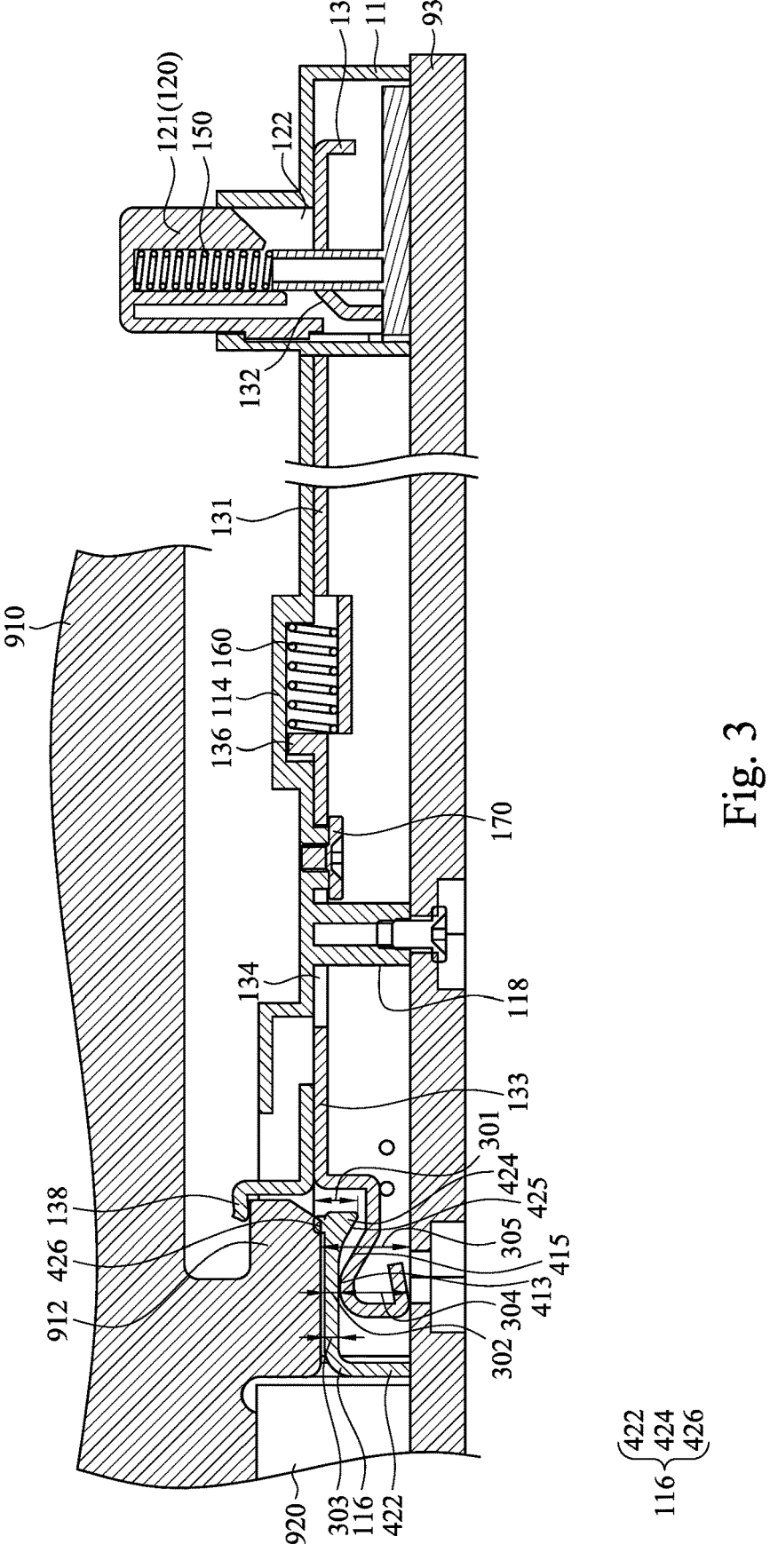
FIG. 3 is a schematic cross sectional side view of the interface card quick release device installed in an interface card connection slot.
Figure 4:
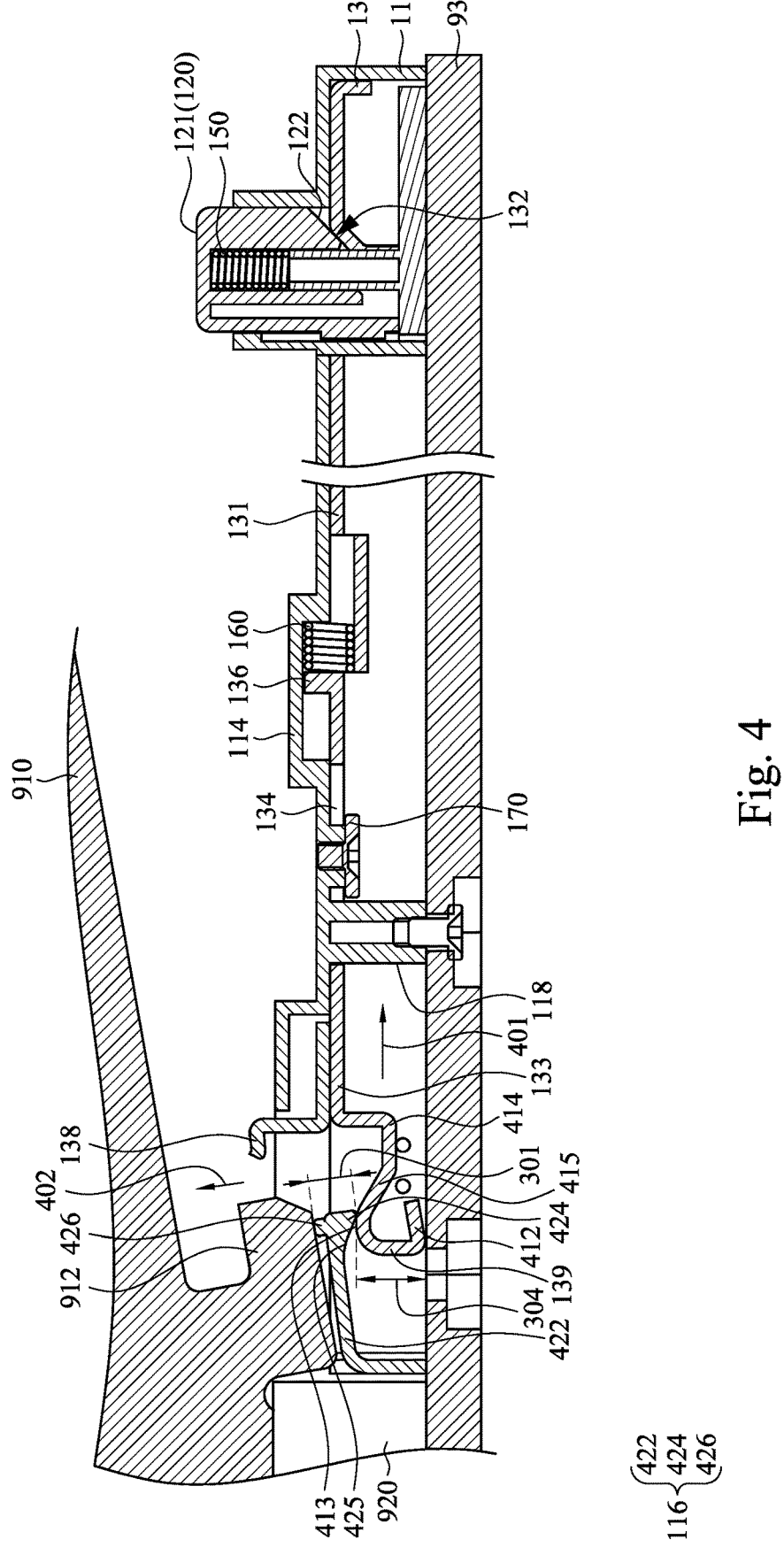
FIG. 4 is a schematic cross sectional side view of the interface card quick release device when the interface card is removed from the interface card connection slot.
Figure 5:
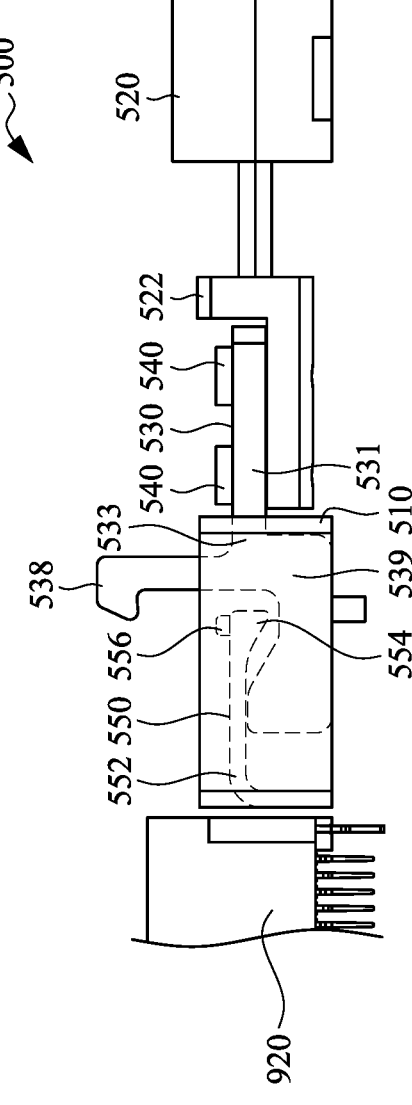
FIG. 5 illustrates a schematic side view of an interface card quick release device according to another embodiment of the present invention.
Figure 6:
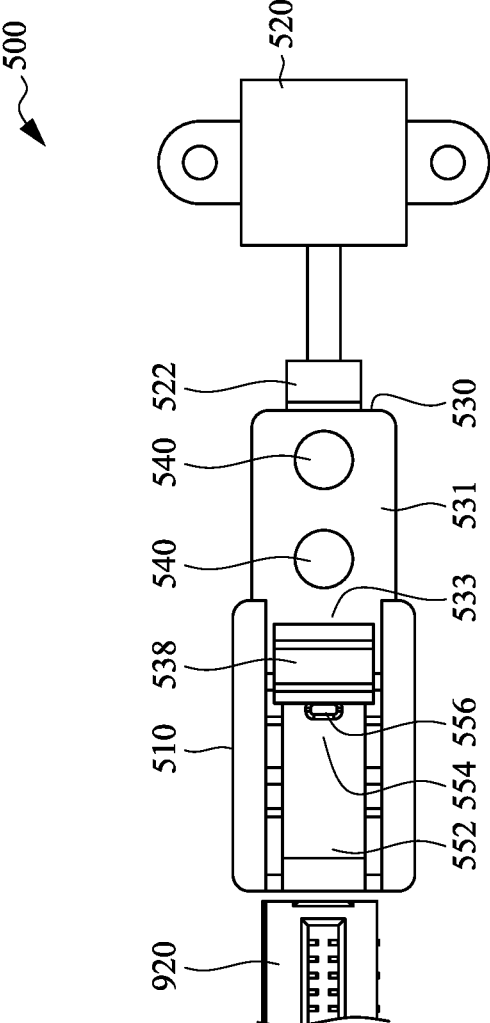
FIG. 6 illustrates a schematic top view of the interface card quick release device according to another embodiment of the present invention.
Figure 7:
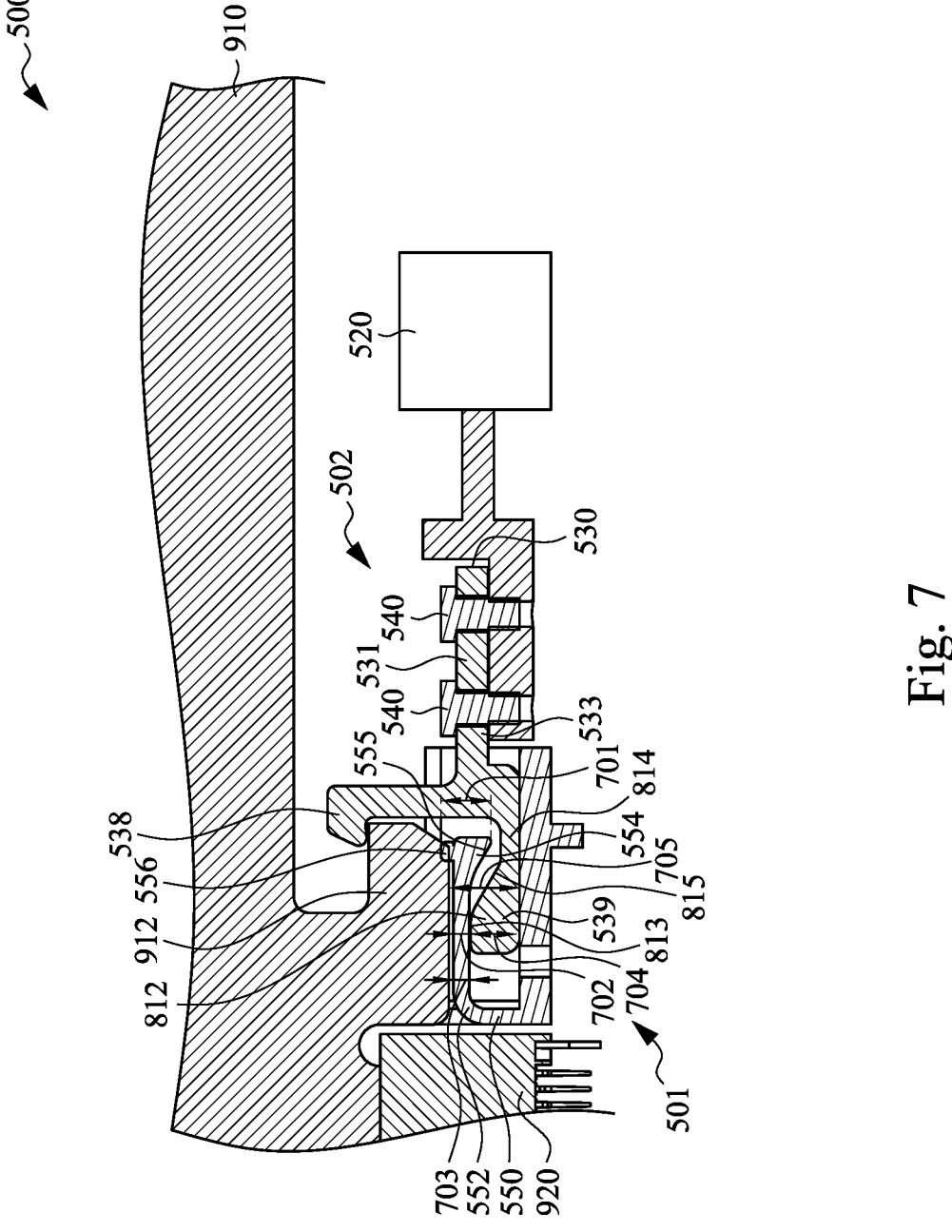
FIG. 7 is a schematic cross sectional side view of the interface card quick release device installed in the interface card connection slot as illustrated in FIG. 5.
Figure 8:
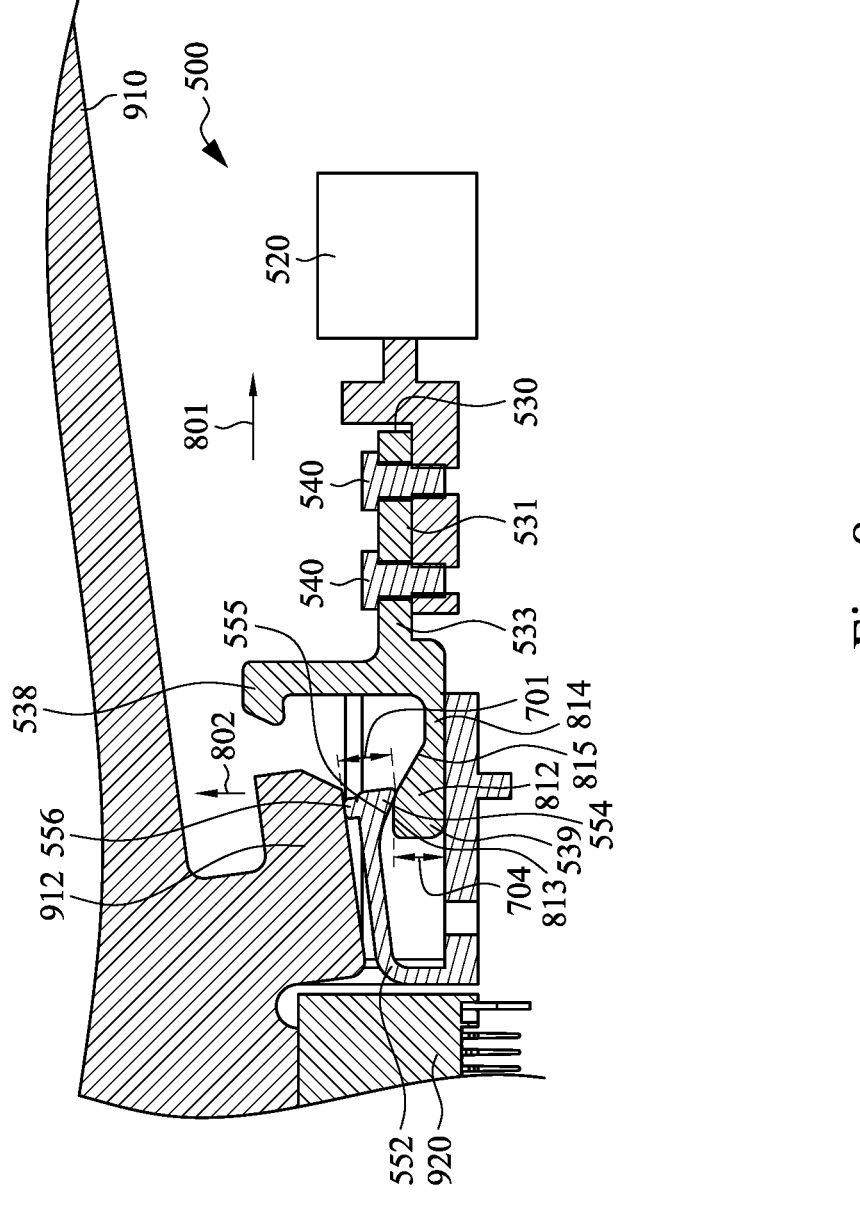
FIG. 8 is a schematic cross sectional side view of the interface card quick release device when the interface card is removed from the interface card connection slot as illustrated in FIG. 5.

FIG. 1 illustrates a schematic perspective diagram of an interface card quick release device and FIG. 2 is a schematic exploded perspective diagram thereof. FIG. 3 is a schematic cross sectional side view of the interface card quick release device installed in an interface card connection slot and FIG. 4 is a schematic cross sectional side view of the interface card quick release device when the interface card is removed from the interface card connection slot. In addition, FIG. 5 illustrates a schematic side view of an interface card quick release device according to another embodiment of the present invention, and FIG. 6 illustrates a schematic top view thereof. FIG. 7 is a schematic cross sectional side view of the interface card quick release device installed in the interface card connection slot and FIG. 8 is a schematic cross sectional side view of the interface card quick release device when the interface card is removed from the interface card connection slot.

First referring to FIG. 1 and FIG. 2, the interface card quick release device 100 includes a housing 110, a release device 120 and a release link 130. The interface card connection slot 920 is arranged outside one end of the interface card quick release device 100. The release link 130 is connected to the release device 120, and the release link 130 is arranged in the housing 110. In addition, the housing 110 includes an ejector 116 integrally formed with the housing 110 or made separately and then assembled together. The release link 130 includes a first end 101 and a second end 102, the first end 101 of the release link 130 is movably coupled to the ejector 116 to push up the interface card 910 installed in the interface card connection slot 920 so as to conveniently remove the interface card 910 from the interface card connection slot 920.

In some embodiments, the release device 120 is for example a release button 121, and the release button 121 includes a first slope 122, the release link 130 includes a second slope 132, the first slope 122 of the release button 121 may contact the second slope 132 of the release link 130 to move the release link 130.

Simultaneously referring to FIG. 3 and FIG. 4, when the release device 120 is pressed, the first slope 122 of the release button 121 may move down to contact the second slope 132 of the release link 130 to move the release link 130 to the right side of the drawing along the arrow 401, and at the moment, the ejector 116 located at the first end 101 of the release link 130 is pushed up by the release link 130 to move up the interface card 910 along the arrow 402 so that the interface card 910 is escaped from the interface card connection slot 920. Therefore, the interface card 910 may be conveniently removed from the interface card connection slot 920 for replacement or repair.

Because that the interface card quick release device 100 is arranged outside one end of the interface card connection slot 920, the interface card 910 may conveniently be removed by the user, especially some interface card connection slots 920 are arranged under other devices, for example, under the heat dissipation device of the computer. Therefore, the interface card 910 can conveniently be removed from the interface card connection slot 920 rather than first removing the heat dissipation device and then replacing or repairing the interface card 910 so as to effectively improve the efficiency and quality of the replacement or repair of the interface card 910.

Similarly, the interface card quick release device 100 may also arranged in computer equipment with a limited internal space to conveniently remove the interface card 910 so as to effectively improve the efficiency and quality of the replacement or repair of the interface card 910, without departing from the spirit and protection scope of the present invention.

In some embodiments, the housing 110 includes a release device storage hole 112, and the release device 120 is arranged in the release device storage hole 112 and able to move up and down. The interface card quick release device 100 further includes a spring 150 and a release device bottom plate 140, and the release device bottom plate 140 includes a bottom plate main body 144 and a pillar 142. The bottom plate main body 144 of the release device bottom plate 140 is fixed under the housing 110, the pillar 142 passes through the spring 150, and the spring 150 is connected to the release device 120 to reset the release device 120 with the spring 150 after the release device 120 is pressed.

In some embodiments, the release link 130 includes a link main body 131, a plurality of sliding slot 134, a claw 138 and a release bulge 139. The sliding slot 134 is formed on the link main body 131, and the claw 138 is fixed on a first side 133 of the link main body 131 to engage with the interface card locking protrusion 912 of the interface card 910 so as to effectively fix the interface card 910. In addition, the release bulge 139 is extended outwardly from the first side 133 of the link main body 131 to push up the ejector 116 so as to further push up the interface card 910 along the arrow 402.

In some embodiments, the release link 130 further includes a stop bump 136 connected to a spring 160, and the spring 160 is accommodated in a spring receiving compartment 114 of the housing 110. When a user releases the release device 120, the spring 160 may provide the spring force to reset the release link 130.

In some embodiments, the interface card quick release device 100 includes a plurality of sliding slot screws 170 passing through the sliding slots 134 and fixing on the housing 110 so that the release link 130 is movable relative to the housing 110.

In some embodiments, the sliding slot screw 170 includes a threaded portion 172 and a screw head 174, the screw head 174 is connected to the threaded portion 172, and the threaded portion 172 is able to pass through the sliding slot 134 and fixed on the housing 110 to effectively support the release link 130 with the screw head 174 of the sliding slot screw 170.

In some embodiments, the interface card quick release device 100 further includes a sliding guide rod 118 passing through the sliding slot 134 and fixed on the housing 110 to allow the release link 130 to move relative to the housing 110.

In some embodiments, the release bulge 139 includes a concave connecting portion 414 and a U-shaped bulge 412. The concave connecting portion 414 is extended outwardly from the first side 133 of the link main body 131. The concave connecting portion 414 may be integrally formed with the release link 130 or made separately and then assembled together, without departing from the spirit and protection scope of the present invention. The U-shaped bulge 412 is further connected to the concave connecting portion 414 to push up the ejector 116, and further push up the interface card 910 along the arrow 402.

In some embodiments, the ejector 116 includes a connecting portion 422 and an eject block 424. The eject block 424 is connected to the connecting portion 422. When the interface card 910 is installed in the interface card connection slot 920, the U-shaped bulge 412 of the release bulge 139 is arranged under the connecting portion 422 and the eject block 424 is located above the concave connecting portion 414 to allow the interface card 910 to be installed in the interface card connection slot 920 without interfering with the ejector 116.

In some embodiments, the bottom of the eject block 424 includes a lifting slope 425, and one side of the concave connecting portion 414 includes a gentle rise slope 415. When the release device 120 is pressed, the release link 130 moves along the arrow 401 toward the right side of the drawing. At the moment, the gentle rise slope 415 of the concave connecting portion 414 also moves toward the right side of the drawing to contact the lifting slope 425 of the eject block 424 so that the gentle rise slope 415 may gradually lift the lifting slope 425 to lift the eject block 424 of the ejector 116 and then the lifting slope 425 contacts an upper surface 413 of the U-shaped bulge 412 of the release bulge 139 to effectively and gradually lift the interface card 910 along the arrow 402 until the interface card 910 is escaped from the interface card connection slot 920. Therefore, the user may conveniently remove the interface card 910 for replacement or repair.

In some embodiments, the ejector 116 further includes a pushing protrusion 426 disposed on the eject block 424 to reduce the friction therebetween so as to conveniently lift the interface card 910.

In some embodiments, the ejector 116 may arranged on one side of the interface card connection slot 920 or only one end of the connecting portion 422 of the ejector 116 is directly fixed on a side wall of the interface card connection slot 920 rather than fixed on the housing 110.

In some embodiments, when the interface card 910 is installed in the interface card connection slot 920, the thickness 303 of the connecting portion 422 is smaller than the second height 302 measured from the bottom of the interface card locking protrusion 912 of the interface card 910 to the top of the U-shaped bulge 412. Therefore, the interface card 910 may stably be installed in the interface card connection slot 920.

In some embodiments, the connecting portion 422 is preferably an L-shaped connecting portion.

In some embodiments, when the interface card 910 is installed in the interface card connection slot 920, a first height 301 of the pushing protrusion 426 and the eject block 424 plus a third height 304 of the U-shaped bulge 412 is greater than a fourth height 305 measured from the bottom of the interface card locking protrusion 912 of the interface card 910 to the bottom of the U-shaped bulge 412. Therefore, as shown in FIG. 4, when the release link 130 moves to the right, the U-shaped bulge 412 may lift the pushing protrusion 426 and the eject block 424 so as to lift the interface card 910 with the pushing protrusion 426 along the arrow 402. In addition, the bottom of the U-shaped bulge 412 may directly contact an upper surface of a main board 930 on which the interface card quick release device 100 is disposed or an internal surface of the bottom of the housing 110 of the interface card quick release device 100 according to design requirements, without departing from the spirit and protection scope of the present invention.

In some embodiments, when the interface card 910 is installed in the interface card connection slot 920, a first height 301 of the pushing protrusion 426 and the eject block 424 is greater than the second height 302 measured form the bottom of the interface card locking protrusion 912 of the interface card 910 to the top of the U-shaped bulge 412. Therefore, when the release link 130 moves to the right, the top of the U-shaped bulge 412 may push the pushing protrusion 426 and the eject block 424 upward, so that the interface card 910 is pushed upward along the arrow 402 by the pushing protrusion 426.

According to another aspect of the present application, an interface card quick release device 500 is provided. The release device 520 is an electromagnetic actuator or a motor to conveniently push the interface card 910 upward along the arrow 802 so that the user may conveniently remove the interface card 910 from the interface card connection slot 920.

Simultaneously referring to FIGS. 5 to 8, the interface card quick release device 500 includes a housing 510, a release device 520 and a release link 530. The interface card connection slot 920 is arranged outside one end of the interface card quick release device 500. The release link 530 is connected to the release device 520, and the release link 530 is arranged in the housing 510. In addition, the housing 510 includes an ejector 550 integrally formed with the housing 510 or made separately and then assembled together. The release link 530 includes a first end 501 and a second end 502, the first end 501 of the release link 530 is movably coupled to the ejector 550 to push up the interface card 910 installed in the interface card connection slot 920 so as to conveniently remove the interface card 910 from the interface card connection slot 920.

In some embodiments, the release device 520 is, for example, an electromagnetic actuator or a motor to move the release link 530 left or right.

In some embodiments, the release device 520 further includes a connecting portion 522 connected to the release link 530 with a fixing device 540, i.e. a screw or a rivet, so as to move the release link 530 left or right.

Therefore, when the release device 520 is started, the release device 520 may move the release link 530 to the right side of the drawing along the arrow 801, and at the moment, the ejector 550 located at the first end 501 of the release link 530 is pushed up by the release link 530 to move up the interface card 910 along the arrow 802 so as to escape from the interface card connection slot 920. Therefore, the interface card 910 may be conveniently removed from the interface card connection slot 920 to conveniently replace or repair the interface card 910 by the user.

Because that the interface card quick release device 500 is arranged outside one end of the interface card connection slot 920, the interface card 910 may conveniently be removed by the user, especially some interface card connection slots 920 are arranged under other devices, for example, under the heat dissipation device of the computer. Therefore, the interface card 910 can conveniently be removed from the interface card connection slot 920 rather than first removing the heat dissipation device and then replacing or repairing the interface card 910 so as to effectively improve the efficiency and quality of the replacement or repair of the interface card 910. Similarly, the interface card quick release device 500 may also arranged in computer equipment with a limited internal space to conveniently remove the interface card 910 so as to effectively improve the efficiency and quality of the replacement or repair of the interface card 910, without departing from the spirit and protection scope of the present invention.

In some embodiments, the release link 530 includes a link main body 531, a claw 538 and a release bulge 539. The claw 538 is fixed on a first side 533 of the link main body 531 to engage with the interface card locking protrusion 912 of the interface card 910 so as to fix the interface card 910. In addition, the release bulge 539 is extended outwardly from the first side 533 of the link main body 531 to push up the ejector 550 so as to further push up the interface card 910 along the arrow 802.

In some embodiments, the release bulge 539 includes a concave connecting portion 814 and a solid bulge 812. The concave connecting portion 814 is extended outwardly from the first side 533 of the link main body 531. The concave connecting portion 814 may be integrally formed with the release link 530 or made separately and then assembled together, without departing from the spirit and protection scope of the present invention. The solid bulge 812 is further connected to the concave connecting portion 814 to push up the ejector 550, and further push up the interface card 910 along the arrow 802. In some embodiments, the release bulge 139 shown in FIGS. 1 to 4 may also be used as the release bulge 539 in the embodiments of FIGS. 5 to 8, or the release bulge 539 may be used in the embodiments of FIGS. 1 to 4, without departing from the spirit and scope of the invention.

In some embodiments, the ejector 550 includes a connecting portion 552 and an eject block 554. The eject block 554 is connected to the connecting portion 552, when the interface card 910 is installed in the interface card connection slot 920, the solid bulge 812 of the release bulge 539 is arranged under the connecting portion 552 and the eject block 554 is located above the concave connecting portion 814 to allow the interface card 910 to be installed in the interface card connection slot 920 without interfering with the ejector 550.

In some embodiments, the bottom of the eject block 554 includes a lifting slope 555, and one side of the concave connecting portion 814 includes a gentle rise slope 815. When the release device 520 is pressed, the release link 530 moves along the arrow 801 toward the right side of the drawing. At the moment, the gentle rise slope 815 of the concave connecting portion 814 also moves toward the right side of the drawing to contact to the lifting slope 555 of the eject block 554 so that the gentle rise slope 815 may gradually lift the lifting slope 555 and then the lifting slope 555 contacts an upper surface 813 of the solid bulge 812 of the release bulge 539 to effectively and gradually lift the interface card 910 along the arrow 802 until the interface card 910 is escaped from the interface card connection slot 920. Therefore, the user may conveniently remove the interface card 910 for replacement or repair.

In some embodiments, the connecting portion 552 is preferably an L-shaped connecting portion.

In some embodiments, the ejector 550 further includes a pushing protrusion 556 disposed on the eject block 554 to reduce the friction therebetween so as to conveniently lift the interface card 910.

In some embodiments, the ejector 550 may arranged on one side of the interface card connection slot 920 or only one end of the connecting portion 552 of the ejector 550 is directly fixed on a side wall of the interface card connection slot 920 rather than fixed on the housing 510.

In some embodiments, when the interface card 910 is installed in the interface card connection slot 920, the thickness 703 of the connecting portion 552 is smaller than the second height 702 measured from the bottom of the interface card locking protrusion 912 of the interface card 910 to the top of the solid bulge 812. Therefore, the interface card 910 may stably be installed in the interface card connection slot 920.

In some embodiments, when the interface card 910 is installed in the interface card connection slot 920, a first height 701 of the pushing protrusion 556 and the eject block 554 plus a third height 704 of the solid bulge 812 is greater than a fourth height 705 measured from the bottom of the interface card locking protrusion 912 of the interface card 910 to the bottom of the solid bulge 812. Therefore, as shown in FIG. 8, when the release link 530 moves to the right, the solid bulge 812 may lift the pushing protrusion 556 and the eject block 554 so as to lift the interface card 910 with the pushing protrusion 556 along the arrow 802.

In some embodiments, when the interface card 910 is installed in the interface card connection slot 920, a first height 701 of the pushing protrusion 556 and the eject block 554 is greater than the second height 702 measured form the bottom of the interface card locking protrusion 912 of the interface card 910 to the top of the solid bulge 812. Therefore, when the release link 530 moves to the right, the top of the solid bulge 812 may push the pushing protrusion 556 and the eject block 554 upward, so that the interface card 910 is pushed upward along the arrow 802 by the pushing protrusion 556.

Accordingly, the interface card quick release device according to some embodiments of the present disclosure may effectively move the interface card upward by manually or electrically, so that the user does not have to directly contact the interface card to lift the interface card. Therefore, the user may conveniently remove the interface card from the interface card connection slot so as to effectively improve the efficiency and quality of the replacement or repair of the interface card.

Although the present disclosure has been disclosed above in terms of implementation, it is not intended to limit the present disclosure. Any person with ordinary knowledge in the field may make various variations and modifications without departing from the spirit and scope of the disclosure. Therefore, the spirit and scope of the appended claims should not be limited to the description of the embodiments contained herein.

What is claimed is:

1. An interface card quick release device, comprising:
a housing;
a release device; and
a release link arranged in the housing, wherein the housing comprises an ejector, a first end of the release link is movably coupled to the ejector, and the release device controls the release link to push up an interface card, wherein the release link comprises:
a link main body;
a sliding slot formed on the link main body;
a claw fixed on a first side of the link main body to fix the interface card; and
a release bulge extending outwardly from the first side of the link main body to push up the ejector so as to push up the interface card; and
a sliding guide rod passing through the sliding slot and fixed on the housing so that the release link is movable relative to the housing.

2. The interface card quick release device of claim 1, wherein the release device comprises a release button, wherein the release button comprises a first slope, the release link comprises a second slope, and the first slope of the release button contacts the second slope of the release link to move the release link.

3. The interface card quick release device of claim 2, further comprising a spring and a release device bottom plate, wherein the release device bottom plate is fixed to the housing, the release device bottom plate comprises a bottom plate main body and a pillar, and the spring is disposed between the release button and the pillar to reset the release button.

4. The interface card quick release device of claim 1, wherein the release link further comprises:
a stop bump coupled to a spring to reset the release link.

5. An interface card quick release device, comprising:
a housing;
a release device;
a release link arranged in the housing, wherein the housing comprises an ejector, a first end of the release link is movably coupled to the ejector, and the release device controls the release link to push up an interface card, wherein the release link comprises:
a link main body;
a sliding slot formed on the link main body;
a claw fixed on a first side of the link main body to fix the interface card; and
a release bulge extending outwardly from the first side of the link main body to push up the ejector so as to push up the interface card; and
a sliding slot screw comprising a threaded portion and a screw head, the screw head connected to the threaded portion, the threaded portion passing through the sliding slot to fix on the housing so as to support the release link with the screw head of the sliding slot screw.

6. An interface card quick release device, comprising:
a housing;
a release device; and
a release link arranged in the housing, wherein the housing comprises an ejector, a first end of the release link is movably coupled to the ejector, and the release device controls the release link to push up an interface card, wherein the release link comprises:
a link main body;
a sliding slot formed on the link main body:
a claw fixed on a first side of the link main body to fix the interface card; and
a release bulge extending outwardly from the first side of the link main body to push up the ejector so as to push up the interface card,
wherein the release bulge comprises:
a concave connecting portion extending outwardly from the first side of the link main body; and
a U-shaped bulge connected to the concave connecting portion.

7. The interface card quick release device of claim 6, wherein the ejector comprises:
a connecting portion; and
an eject block connected to the connecting portion, wherein the U-shaped bulge of the release bulge is arranged under the connecting portion, and the eject block is arranged above the concave connecting portion when the interface card is installed in an interface card connection slot.

8. The interface card quick release device of claim 7, wherein the eject block comprises a lifting slope, and the concave connecting portion comprises a gentle rise slope to gradually push up the eject block by moving the gentle rise slope to contact the lifting slope of the eject block.

9. The interface card quick release device of claim 7, wherein the ejector further comprises:

a pushing protrusion arranged on the eject block.

10. The interface card quick release device of claim 7, wherein a thickness of the connecting portion is smaller than a second height measured from a bottom of an interface card locking protrusion of the interface card to a top of the U-shaped bulge when the interface card is installed in the interface card connection slot.

11. The interface card quick release device of claim 9, wherein a first height of the pushing protrusion and the eject block plus a third height of the U-shaped bulge is greater than a fourth height measured from a bottom of an interface card locking protrusion of the interface card to a bottom of the U-shaped bulge when the interface card is installed in the interface card connection slot.

12. The interface card quick release device of claim 9, wherein a first height of the pushing protrusion and the eject block is greater than a second height measured from a bottom of an interface card locking protrusion of the interface card to a top of the U-shaped bulge when the interface card is installed in the interface card connection slot.

13. The interface card quick release device of claim 1, wherein the release device comprises an electromagnetic actuator or a motor.

\* \* \* \* \*